United States Patent
Higuchi et al.

(10) Patent No.: US 7,537,462 B2
(45) Date of Patent: May 26, 2009

(54) CONNECTOR OF A DOUBLE-SIDED CONNECTION TYPE WITH A FLEXIBLE INTERNAL MECHANISM

(75) Inventors: Koji Higuchi, Tokyo (JP); Seiya Matsuo, Tokyo (JP); Takashi Kuwahara, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 12/154,919

(22) Filed: May 28, 2008

(65) Prior Publication Data

US 2008/0299805 A1  Dec. 4, 2008

(30) Foreign Application Priority Data

May 31, 2007  (JP)  ............................. 2007-144470

(51) Int. Cl.
*H01R 12/00*  (2006.01)
(52) U.S. Cl. ........................................................ 439/71
(58) Field of Classification Search .................. 439/71, 439/61, 91
See application file for complete search history.

(56) References Cited

U.S. PATENT DOCUMENTS

| 3,904,262 | A | * | 9/1975 | Cutchaw ....................... 439/71 |
| 5,493,237 | A | * | 2/1996 | Volz et al. ..................... 324/754 |
| 7,168,966 | B2 | | 1/2007 | Higuchi et al. |

FOREIGN PATENT DOCUMENTS

| JP | 2005-228504 | 8/2005 |
| JP | 2006-054149 | 2/2006 |

* cited by examiner

*Primary Examiner*—Phuong K Dinh
(74) *Attorney, Agent, or Firm*—Collard & Roe, P.C.

(57) ABSTRACT

In a connector to be connected by press contact in a connecting direction, plural contacts are coupled to a first frame having two principal surfaces opposite to each other in the connecting direction. A second frame is coupled to the first frame and guides the first frame in a specific direction perpendicular to the connecting direction. Each of the contacts includes an insulating elastic member and a conductor combined with the elastic member. The conductor includes portions protruding from the principal surfaces, respectively.

12 Claims, 8 Drawing Sheets

US 7,537,462 B2

CONNECTOR OF A DOUBLE-SIDED CONNECTION TYPE WITH A FLEXIBLE INTERNAL MECHANISM

This application is based upon and claims the benefit of priority from Japanese patent application No. 2007-144470, filed on May 31, 2007, the disclosure of which is incorporated herein in its entirety by reference.

TECHNICAL FIELD

This invention relates to a connector of a double-sided connection type capable of being electrically connected to connection objects on opposite sides.

BACKGROUND ART

A connector of type is disclosed in Japanese Unexamined Patent Application Publication No. 2005-228504 (JP-A-2005-228504) (hereinafter will be referred to as Patent Document 1) and comprises a frame and a plurality of terminal portions (contacts) supported by the frame. Each of the contacts includes an insulating elastic member and a conductor disposed on a surface of the elastic member. The conductor protrudes from the frame on opposite sides.

Another connector of the type is disclosed in Japanese Unexamined Patent Application Publication No. 2006-54149 (JP-A-2006-54149) (hereinafter will be referred to as Patent Document 2) and includes a contact, a plate-like base insulator holding the contact, and a frame holding the base insulator. The contact comprises an elastic member and a conductor disposed on a surface of the elastic member. The frame has a positioning pin. The positioning pin is inserted into a positioning hole of the base insulator.

In order to connect connection objects to each of the above-mentioned connectors, the connection objects are brought into press contact with the conductor on opposite sides of the frame. In this state, electrical connection is established between the connection objects and the conductor with elastic deformation of the elastic member. By the connectors of the type, the connection objects having densely arranged connecting portions or pads can be electrically connected on opposite sides of the connector. Therefore, these connectors may be called a connector of a double-sided connection type.

SUMMARY OF THE INVENTION

However, in the connector disclosed in Patent Document 1, the frame is pressed by the elastic member elastically deformed when the connection objects are connected to the connector. As a consequence, the frame may be deformed or broken and the conductor may be damaged to cause contact failure. This problem is caused by an integral structure of the frame and tends to easily occur as the connecting portions of the connection objects are arranged at a higher density.

The connector disclosed in Patent Document 2 is disadvantageous in the following respect. If a clearance between a diameter of the positioning pin and a diameter of the positioning hole is large, wobbling is caused between the frame and the base insulator. In this event, it is difficult to position the connection objects and the conductor of the elastic member with respect to each other. On the other hand, if the clearance between the diameters of the positioning pin and the positioning hole is small, the conductor is pressed by the base insulator to be largely bent when the elastic member is compressed. This results in reduction of lifetime of the connector.

It is therefore an exemplary object of this invention to provide a connector of a double-sided connection type which is reduced in possibility of occurrence of breakage or contact failure when connection objects are connected to the connector.

It is another exemplary object of this invention to provide a connector of a double-sided connection type which is prevented from damage due to bending of a conductor and is therefore improved in lifetime.

It is still another exemplary object of this invention to provide a connector of a double-sided connection type which is prevented from occurrence of positioning error between the connector and connection objects.

Other objects of the present invention will become clear as the description proceeds.

According to an exemplary aspect of the present invention, there is provide a connector to be connected by press contact in a connecting direction, the connector comprising a first frame which has two principal surfaces opposite to each other in the connecting direction, a plurality of contacts which are coupled to the first frame, and a second frame which is coupled to the first frame and guides the first frame in a specific direction perpendicular to the connecting direction, wherein each of the contacts comprises an insulating elastic member and a conductor which is combined with the elastic member, and wherein the conductor includes portions which protrude from the principal surfaces, respectively.

DESCRIPTION OF THE EXEMPLARY EMBODIMENT

Figure 1:
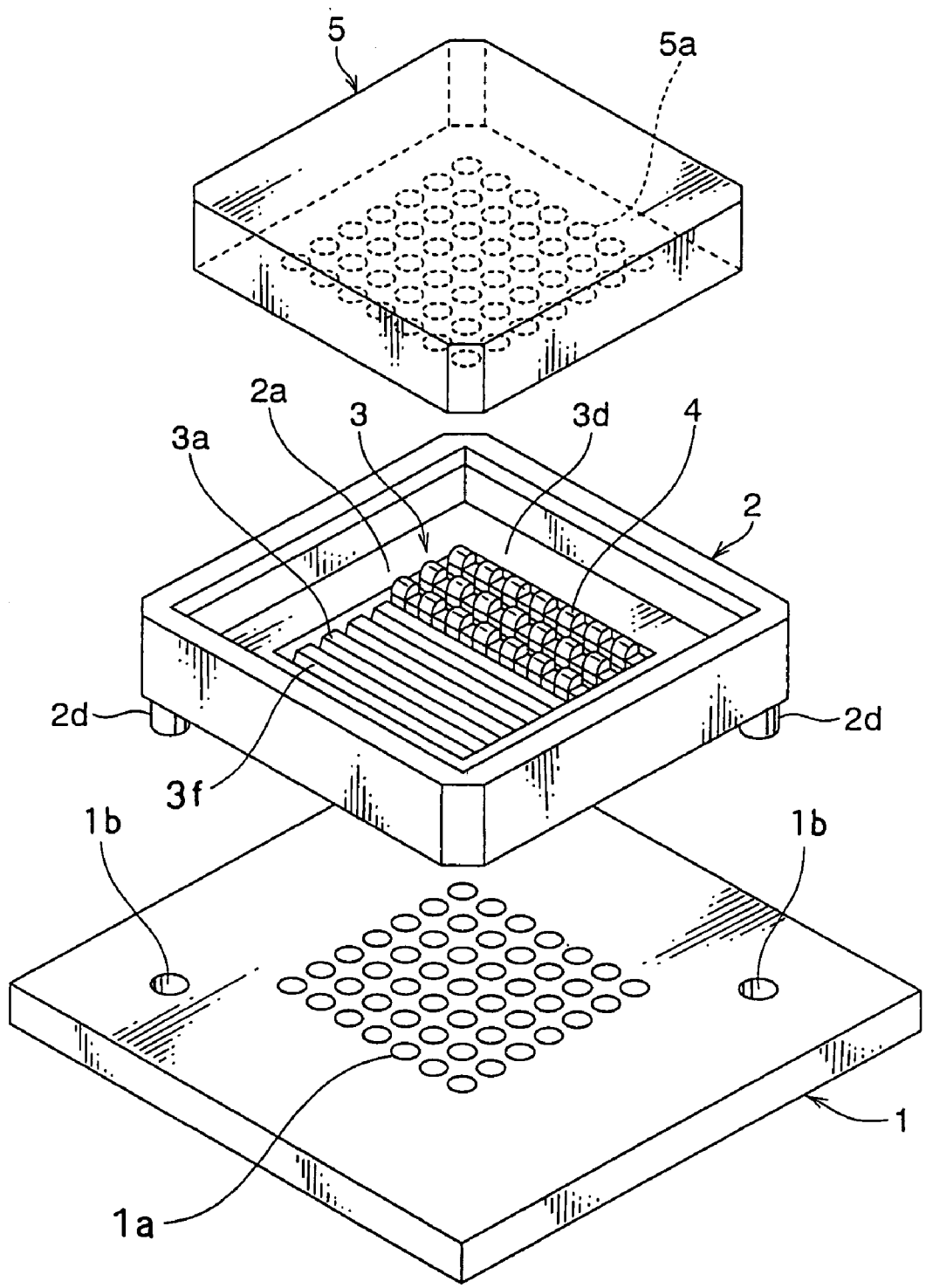
FIG. 1 is a perspective view of a connector according to a first exemplary embodiment of this invention together with connection objects.

At first referring to FIGS. 1, 2A, and 2B, description will be made of a connector according to a first exemplary embodiment of this invention.

The connector is a connector of a double-sided connection type for connecting a connection object (first connection object) 5, such as an IC package, to a printed board (second connection object) 1. The connection object 5 is brought into press contact with the connector from an upper side in a vertical connecting direction A to be connected to the connector.

As a basic structure, the connector comprises a first or an inner frame 3 having upper and lower principal surfaces of a flat shape, a plurality of contact modules coupled to the inner frame 3, and a second or an outer frame 2 allowing the inner frame 3 to be movable and guiding the movement of the inner frame 3. Each of the contact modules includes a plurality of contacts 4 aligned in a single row. Each of the contacts 4 has a conductor 4a formed on a surface of an insulating elastic member 4b and is supported by the inner frame 3 with the conductor 4a protruding from the upper and the lower principal surfaces of the inner frame 3.

The contacts 4 are arranged inside the inner frame 3 in a matrix fashion. Those of the contacts 4 which are arranged in a line along a depth direction perpendicular to a drawing sheet in FIG. 2A are coupled by a strengthening member 4c made of metal or hard resin to form a rod-like contact module. Thus, a plurality of rod-like contact modules are formed by the contacts 4. The contact modules are arranged inside the inner frame 3 in parallel to one another in a transversal direction along the drawing sheet in FIG. 2A, which may be referred to as a specific direction hereinafter.

Specifically, inside the inner frame 3, a plurality of slit portions 3f are arranged at a predetermined interval and partitioned by a plurality of ribs 3a. In the slit portions 3f, the above-mentioned contact modules are disposed, respectively. Thus, the contact modules are held by the slit portions 3f of the inner frame 3.

The outer frame 2 has an opening 2a for receiving the connection object 5. A spring 7 is formed to the outer frame 2 in the vicinity of a side wall of the opening 2a. The spring 7 serves as urging means for urging the inner frame 3 in a first direction B of the specific direction. Specifically, the spring 7 is disposed between the outer frame 2 and the inner frame 3 so as to exert an urging force in the first direction B. The connection object 5 is inserted into the opening 2a with a small clearance.

The inner frame 3 is received in a receiving portion of the outer frame 2. In the opening 2a as a part of the receiving portion, the connection object 5 is brought into press contact with the contacts 4 in the connecting direction A. By the press contact, the insulating elastic members 4b of the contacts 4 are compressed in the connecting direction A. When the insulating elastic members 4b are compressed in the connecting direction A, each of the contacts 4 is deformed in the specific direction. In a case where each of the contacts 4 has structure and a shape which are illustrated in FIG. 2a, the insulating elastic members 4b consequently press the inner frame 3 against the outer frame 2 in a second direction C of the specific direction. Accordingly, when the connection object 5 is connected, the inner frame 3 is moved in the second direction C against the urging force of the spring 7. At this time, upper and lower deformed parts of each contact 4 may protrude in the first direction B as shown in FIG. 2B.

The upper principal surface of the inner frame 3 is faced to the bottom of the opening 2a of the outer frame 2 at the periphery. Thus, a peripheral part of the inner frame 3 serves as a down stopper portion 3d adapted to receive the connection object 5.

The outer frame 2 has an engaging surface 2b faced to the inner frame 3 in the first direction B of the specific direction and a butting surface 2c faced to the inner frame 3 in the second direction C of the specific direction. The engaging surface 2b serves to limit the movement of the inner frame 3 caused by the insulating elastic members 4b. The butting surface 2c is an origin return surface for limiting the movement of the inner frame 3 caused by the spring 7.

The outer frame 2 further has positioning pins 2d integrally formed and adapted to be inserted into positioning holes 1b formed at diagonal corners of the printed board 1 having a plurality of conductive pads 1a.

The outer frame 2 is positioned with respect to the printed board 1 in a state where it is floatable in the connecting direction A. The inner frame 3 is slightly loosely supported so as to allow small wobbling with respect to the outer frame 2 in the connecting direction A and the depth direction.

Figure 2A:
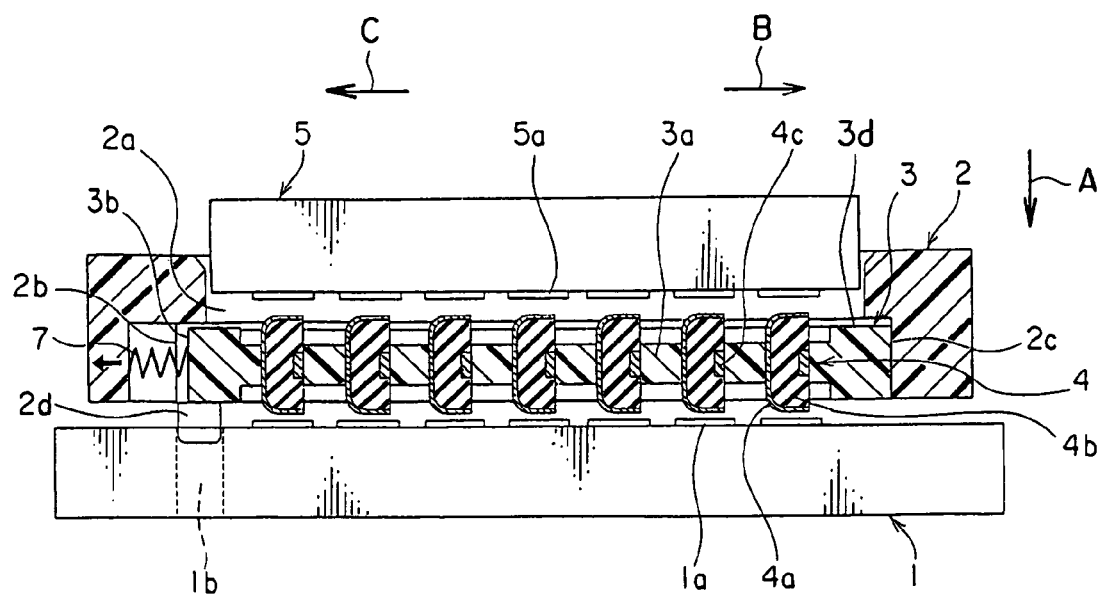
FIG. 2A is a sectional view of the connector and the connection objects illustrated in FIG. 1 in a state before connection.

As shown in FIG. 2A, in a state before connection, the above-mentioned connector is placed on the printed board 1. The positioning pins 2d are inserted and fitted into the positioning holes 1b and the connection object 5 is received and mounted into the opening 2a of the outer frame 2. The printed board 1 and the connection object 5 are pressed against each other by the use of a tool (not shown). Thus, a connected state is obtained.

At the time of connection, as shown in FIG. 2A, in a double frame structure comprising the outer frame 2 and the inner frame 3, a pressing force upon connection between the printed board 1 and the connection object 5 overcomes the urging force of the spring 7 to move the inner frame 3 in the second direction C. Further, when a movable stopper surface 3b of the inner frame 3 is butted against the engaging surface 2b of the outer frame 2 to be stopped. Thus, a connected state illustrated in FIG. 2B is obtained.

Figure 2B:
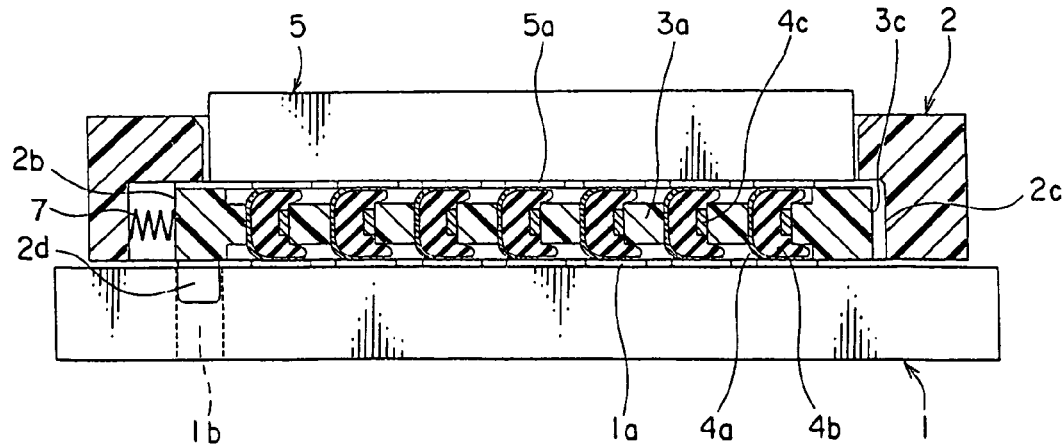
FIG. 2B is a sectional view similar to FIG. 2A but in a state after connection.

In the connected state, the upper and the lower deformed parts of the contacts 4 protrude in the first direction B (rightward in FIG. 2B). As a result, upper protruding parts of the conductors 4a of the contacts 4 are stably contacted with a plurality of conductive pads 5a of the connection object 5. Simultaneously, lower protruding parts of the conductors 4a of the contacts 4 are stably contacted with the conductive pads 1a of the printed board 1. Therefore, even if the pressing force upon connection is considerably large, the ribs 3a are not substantially deformed or damaged. In addition, the contacts 4 hardly suffer from disconnection or short-circuiting and contact failure is reliably prevented.

In detail, when the connection object 5 is pressed in the connecting direction A towards the printed board 1, a force exerted in the second direction C upon compression of the contacts 4 moves together with a compression of the spring 7 the inner frame 3 towards the second direction C from the state before connection illustrated in FIG. 1A. At this time, the movable stopper surface 3b of the inner frame 3 is butted against the engaging surface 2b of the outer frame 2 to restrict further movement of the inner frame 3. Then, the movement of the inner frame 3 is stopped. As a result, the connected state illustrated in FIG. 2A is obtained.

By the movement of the inner frame 3, the force in the second direction C is released. Therefore, it is possible to suppress the problems in the contacts 4, such as short-circuiting and contact failure. Furthermore, each contact 4 stably maintains a deformed shape when it is deformed in the first direction B. It is therefore possible to improve durability during use.

When the printed board 1 and the connection object 5 are removed in the connected state illustrated in FIG. 2B, the state before connection illustrated in FIG. 2A is obtained. In the state before connection, a load (pressing force) is released. Simultaneously, by a restoring force of the spring 7, a butting surface 3c of the inner frame 3 is butted against the butting surface 2c of the outer frame 2. As a consequence, the inner frame 3 is stopped at an initial position.

The spring 7 not only serves to release a force applied to the ribs 3a by the movement of the inner frame 3 in the second direction C when the connection object 5 is mounted but also serves to return the inner frame 3 to the initial position by the restoring force when the connection object 5 is removed. The urging force of the spring 7 is determined depending upon the number of the contacts 4 and generally set to about 490 to 2940 mN.

The outer frame 2 is slightly movable within a range of clearance between the positioning pins 2d and the positioning holes 1b. The inner frame 3 is slightly movable within a range smaller than a distance between the movable stopper surface 3b and the engaging surface 2b. The outer frame 2 and the inner frame 3 are slightly movable in the connecting direction A. Therefore, the balance of clearance is excellent as a whole so that contact failure is prevented and highly reliable connection can be performed.

Next referring to FIGS. 3A and 3B in addition to FIG. 1, description will be made of a connector according to a second exemplary embodiment of this invention. Similar parts are designated by like reference numerals and description thereof will be omitted.

The connector is also a connector of a double-sided connection type for connecting the connection object (first connection object) 5 to the printed board (second connection object) 1. The connection object 5 is brought into press contact with the connector from the upper side in the vertical connecting direction A to be connected to the connector.

The outer frame 2 has a pair of tapered surfaces 2e faced to each other in the specific direction (first and second directions B and C). The inner frame 3 has a pair of tapered surfaces 3e faced to the tapered surfaces 2e of the outer frame 2, respectively. Each of the tapered surfaces 2e and 3e has a predetermined inclination angle with respect to the connecting direction A. Therefore, the outer frame 2 and the inner frame 3 are brought into contact with each other at the tapered surfaces 2e and 3e.

Responsive to the pressing force upon connection with the connection object 5, the tapered surfaces 3e of the inner frame 3 are guided along the tapered surfaces 2e of the outer frame 2. Specifically, upon connection with the connection object 5, the inner frame 3 is guided in an oblique direction D inclined with respect to both of the connecting direction A and the specific direction (B, C). In other words, the inner frame 3 is movable by means of the tapered surfaces 2e and 3e in the oblique direction D forming an angle with respect to the specific direction (B, C) and the connecting direction A. Therefore, the inner frame 3 is movable with respect to the outer frame 2 not only in the specific direction (B, C) but also in the connecting direction A. Herein, the tapered surfaces 2e of the outer frame 2 serve as guiding surfaces for guiding the inner frame 3 in the oblique direction D while the tapered surfaces 3e of the inner frame 3 serve as guided surfaces parallel to the tapered surfaces 2e. The predetermined inclination angle of the tapered surfaces 2e and 3e is determined so that the inner frame 3 is moved with respect to the outer frame 2 by the pressing force exerted upon connection between the connection object 5 and the printed board 1.

The inner frame 3 is supported with respect to the outer frame 2 with a small clearance in the depth direction perpendicular to the drawing sheet. Thus, the inner frame 3 is supported in a floatable state with respect to the outer frame 2 with a small clearance between the tapered surfaces 2e and 3e. The connection object 5 is inserted into the opening 2a of the outer frame 2 with a small clearance.

Like in the first embodiment described in connection with FIGS. 2A and 2B, the connection object 5 and the printed board 1 are connected in the following manner. In a state before connection, the connector is placed on the printed board 1. The positioning pins 2d are inserted and fitted into the positioning holes 1b and the connection object 5 is received and mounted into the opening 2a of the outer frame 3. The printed board 1 and the connection object 5 are pressed against each other by the use of a tool (not shown). Thus, a connected state is obtained. In the state before connection, the connector and the printed board 1 may preliminarily be fitted and connected to each other by pressing as illustrated in FIG. 3A (half-connected state) for convenience in the connecting operation.

Figure 3A:
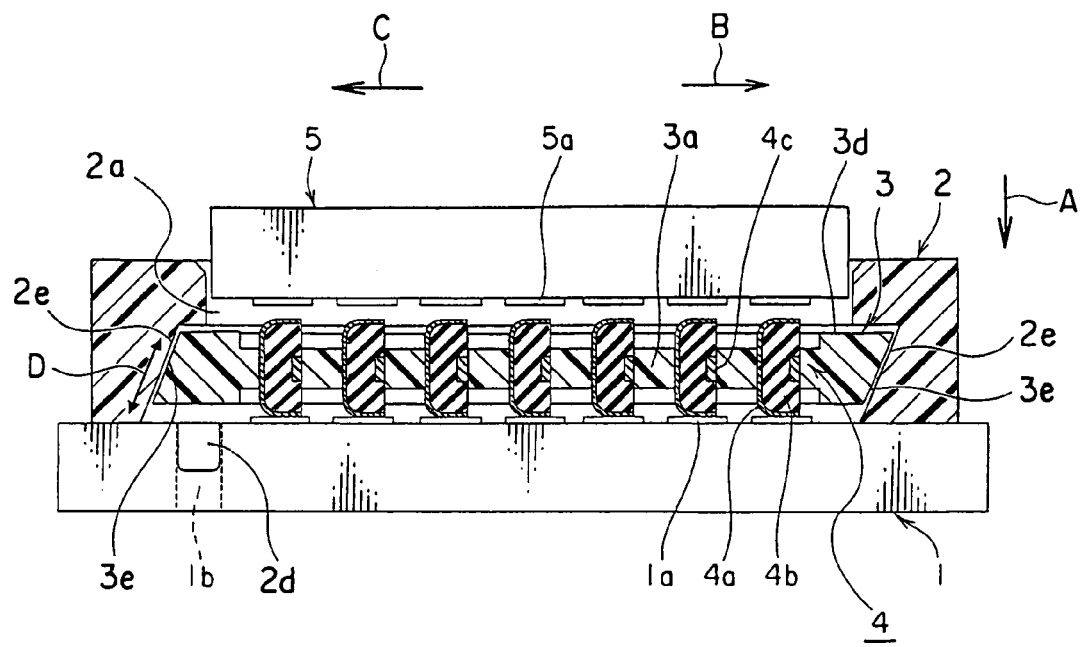
FIG. 3A is a sectional view of a connector according to a second exemplary embodiment of this invention together with connection objects in a state before connection.
Figure 3B:
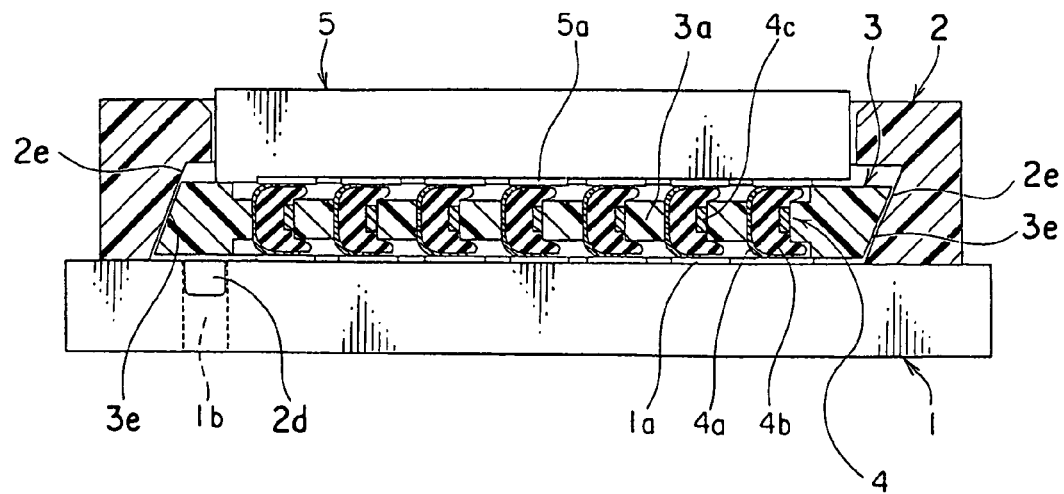
FIG. 3B is a sectional view similar to FIG. 3A but in a state after connection.

In half-connected state illustrated in FIG. 3A, the protruding parts of the conductors 4a of the contacts 4 are preliminarily brought into contact with the pads 1a of the printed board 1. At the time of connection with the connection object 5, in a double frame structure comprising the outer frame 2 and the inner frame 3, the pressing force exerted in the connecting direction A makes the tapered surfaces 3e of the inner frame 3 slide along the tapered surfaces 2e of the outer frame 2 to move the inner frame 3 in the oblique direction D.

The movement of the inner frame 3 is stopped when the conductors 4a of the contacts 4 are butted against the pads 5a of the connection object 5 and the upper and the lower deformed parts of the contacts 4 protrude in the first direction B. As a result, the connected state illustrated in FIG. 3B is obtained. At this time instant, contacting force between the tapered surfaces 2e and 3e is released so that the tapered surfaces 2e and 3e are slightly separated from each other.

When the connection object 5 is removed in the connected state, the connector is returned to the state before connection illustrated in FIG. 3A. In the state where the pressing force is released, a repulsive force (elastic restoring force) of the contacts 4 makes the tapered surfaces 3e of the inner frame 3 move in the oblique direction D along the tapered surfaces 2e of the outer frame 2. Then, the tapered surfaces 3e of the inner frame 3 are brought into contact with the tapered surfaces 2e of the outer frame 2 and slides along the tapered surface 2e.

Then, as shown in the state before connection illustrated in FIG. 3A, the inner frame 3 is returned to a position at which the contacts 4 are not elastically deformed. At this time instant, the contacting force between the tapered surfaces 2e and 3e is released so that the tapered surfaces 2e and 3e are slightly separated from each other.

Thus, the outer frame 2 is slightly movable within the range of clearance between the positioning pins 2d and the positioning holes 1b. The inner frame 3 is slightly movable with respect to the opening 2a of the outer frame 2 in the depth direction of the drawing sheet, which is perpendicular to the connecting direction A, and in the oblique direction D. As a result, the balance of clearance is excellent as a whole. Therefore, contact failure is prevented and highly reliable connection can be performed.

Referring to FIGS. 2A to 3B, description has been made of the structure in which the receiving portion formed in the outer frame 2 to receive the inner frame 3 is also used as the opening 2a for receiving the connection object 5. However, the similar function can be obtained by using another frame which is different from the outer frame 2 and receives both of the outer frame 2 and the inner frame 3. In this event, it is unnecessary to receive the inner frame 3 in the outer frame 2.

Next referring to FIGS. 4 to 10C, description will be made of a connector according to a third exemplary embodiment of this invention. Similar parts are designated by like reference numerals and description thereof will be omitted.

The connector is also a connector of a double-sided connection type for connecting the connection object (first connection object) 5 to the printed board (second connection object) 1. The connection object 5 is brought into press contact with the connector from the upper side in the vertical connecting direction A to be connected to the connector.

Figure 4:
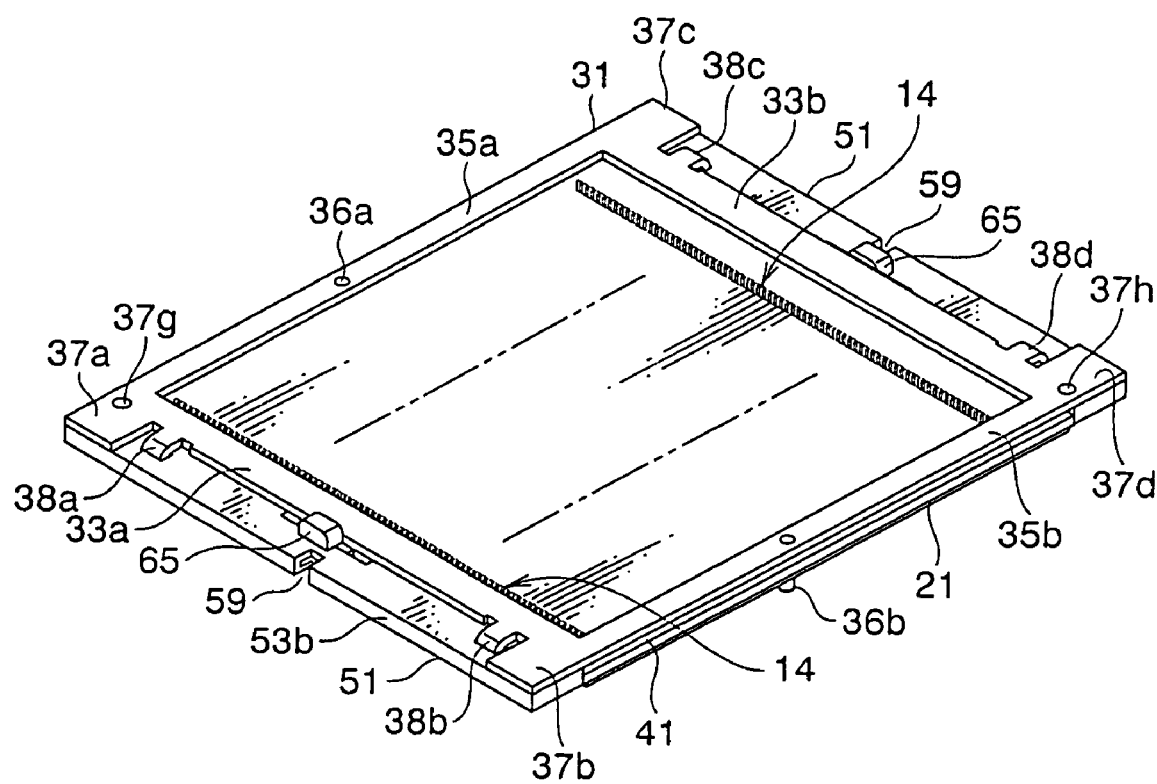
FIG. 4 is a perspective view of a connector according to a third exemplary embodiment of this invention.
Figure 5:
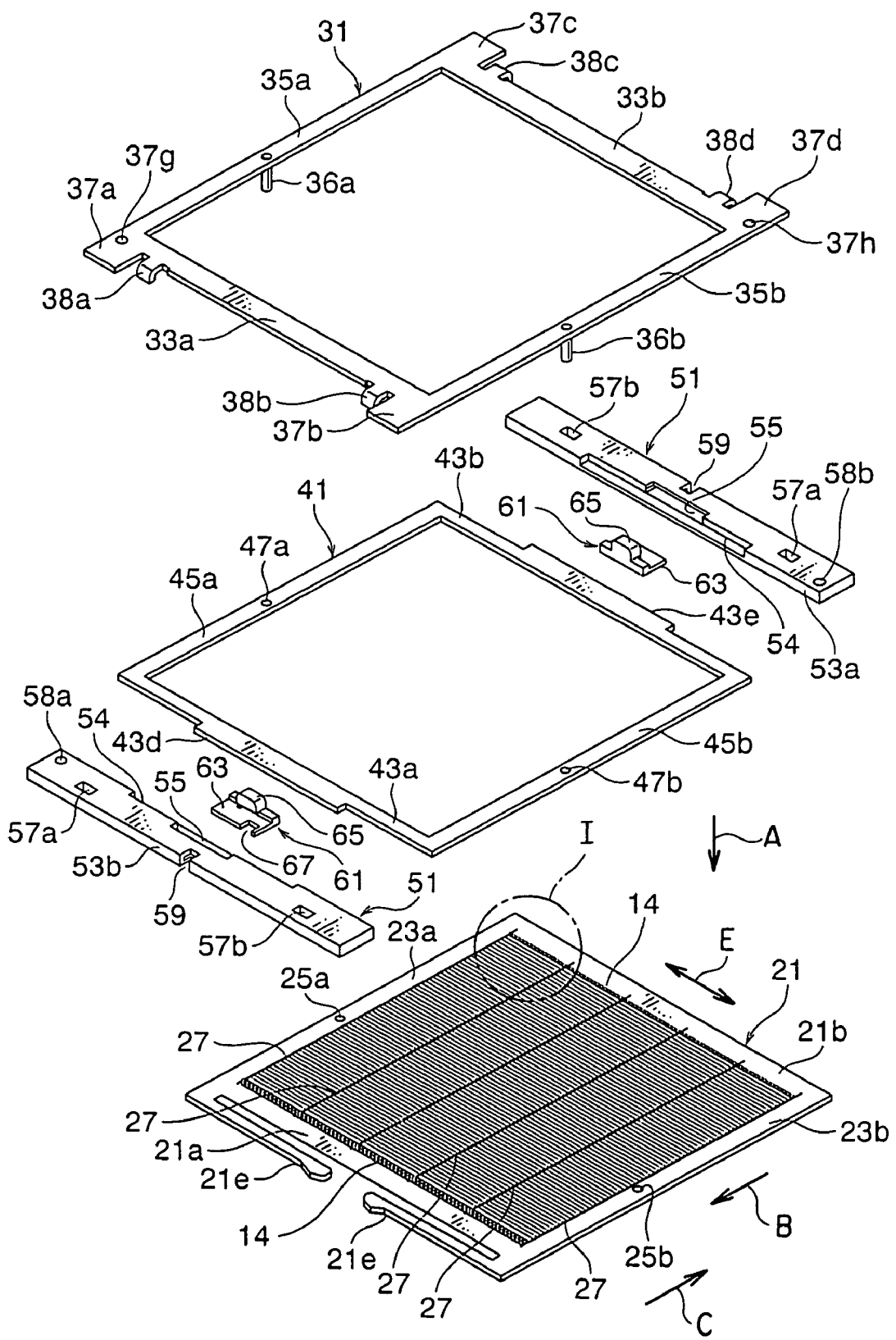
FIG. 5 is an exploded perspective view of the connector illustrated in FIG. 4.

At first referring to FIGS. 4 and 5, the connector has a basic structure which will presently be described. The connector comprises a frame base 21 having opposite principal surfaces and a plurality of contacts 14 supported by the frame base 21. Each of the contacts 14 comprises a conductor 14a formed on a surface of an insulating elastic member 14b and is supported by the frame base 21 so that the conductor 14a protrudes from the opposite principal surfaces thereof. More in detail, the connector includes a frame member 31 holding the frame base 21, a strengthening frame 41 interposed between the frame base 21 and the frame member 31 and attached to the frame base 21, and a pair of block members 51 receiving the strengthening frame 41.

The frame base 21 is integrally provided with a pair of spring portions 21e which serves as urging means so that the frame base 21 is urged in the first direction B perpendicular to the connecting direction A of the connection object 5 when the connector is assembled. The frame member 31 is engaged with the spring portions 21e of the frame base 21 via a sliding mechanism (not shown) attached to the strengthening frame 41. The sliding mechanism allows the frame base 21 to be slidable with respect to the frame member 31 and the strengthening frame 41 in the first and the second directions B and C in FIG. 5 within a range of clearance between the diameter of positioning holes 47a and 47b of the strengthening frame 41 and frame positioning holes 25a and 25b of the frame base 21 and the diameter of positioning pins 36a and 36b of the frame member 31.

In the connector illustrated in FIGS. 4 and 5, a combination of the frame base 21 and the strengthening frame 41 serves as a first frame while a combination of the frame member 31 and the block members 51 serves as a second frame.

Figure 6:
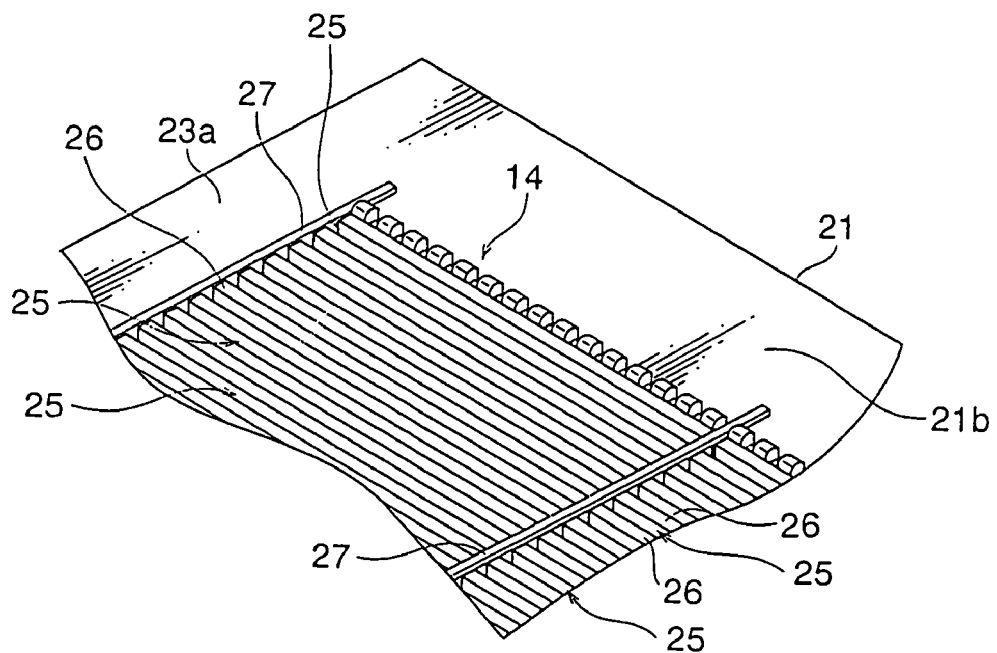
FIG. 6 is an enlarged view of a part I in FIG. 5.
Figure 7A:
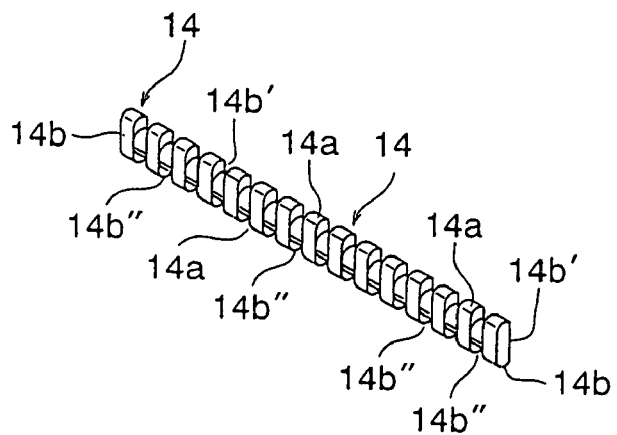
FIG. 7A is an enlarged perspective view of a contact module included in the connector illustrated in FIG. 4.
Figure 7B:
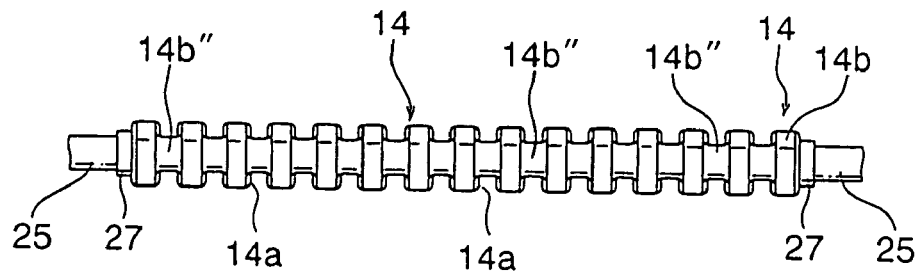
FIG. 7B is an enlarged front view of the contact module illustrated in FIG. 7A.
Figure 8:
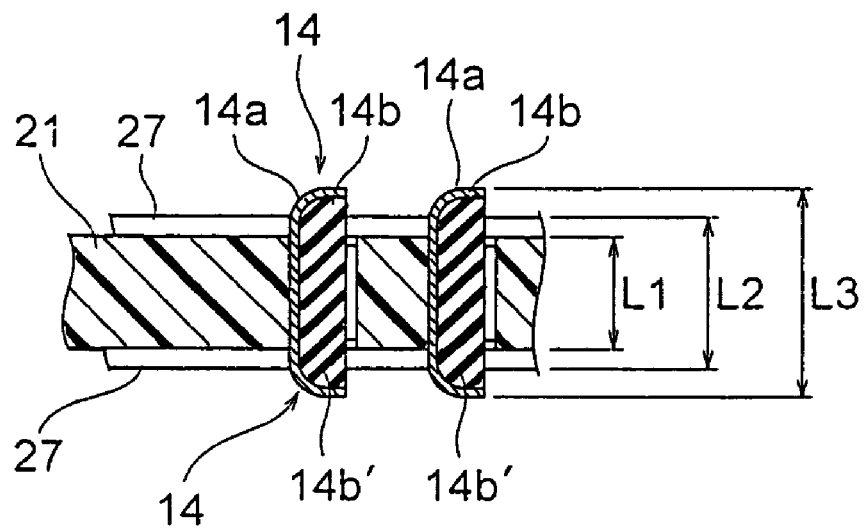
FIG. 8 is an enlarged sectional view of a part of FIG. 6.

Referring to FIGS. 6 to 8, each contact 14 comprises the conductor 14a disposed on the surface of the insulating elastic member 14b, such as rubber, having elasticity. The insulating elastic member 14b has a plurality of base portions 14b' arranged in a standing position in parallel to one another at a predetermined pitch and connected via connecting portions 14b'' in a transversal direction E. The conductor 14a extends along one surface of the base portion 14b' in the connecting direction that is depicted by "A" in FIG. 5. The conductor 14a further continuously extends from the one surface to a pair of side surfaces, namely, upper and lower surfaces which are adjacent to the one surface and opposite to each other in the connecting direction. As illustrated in FIG. 7A, a contact module having an array of the contacts 14, 15 in number, is formed in which the base portions 14b', 15 in number, of the insulating elastic member 14b are connected via the connecting portions 14b'' in the transversal direction E with the conductors 14a disposed on the base portions 14b'.

The frame base 21 is formed by molding a resin material and has a generally rectangular shape. The frame base 21 has a pair of frame base horizontal portions 21a and 21b, a pair of frame base vertical portions 23a and 23b, and a plurality of slit portions 25 formed between the frame base horizontal portions 21a and 21b and the frame base vertical portions 23a and 23b. The frame base horizontal portions 21a and 21b extend in the transversal direction E in parallel to each other and are faced to each other in the first and the second directions B and C. The frame base vertical portions 23a and 23b extend in the first and the second directions B and C in parallel to each other and are faced to each other in the transversal direction E. The spring portions 21e as the urging means are formed by punching and cutting into a generally arm-like shape and are integrally formed on one side of the frame base horizontal portion 21a and connected to opposite ends thereof. The frame base vertical portions 23a and 23b have a function similar to that of the down stopper portion 3d for receiving the connection object 5, which has been described in conjunction with FIGS. 1 to 3B.

It is noted here that the terms "horizontal" and "vertical" in this context refer to those directions on a horizontal plane.

The slit portions 25 are formed in the frame base 21 at an equal interval. The insulating elastic member 14b is disposed in each slit portion 25. Each slit portion 25 penetrates the opposite principal surfaces of the frame base 21. As is clear from FIG. 6, the slit portions 25 are long in the transversal direction E and successively formed in the first and the second directions B and C.

The frame base 21 is provided with a plurality of stopper portions 27 to separate the slit portions 25 in the second direction C. The stopper portions 27 serve to hold the contact modules (FIG. 7A) having a predetermined number of the contacts 14 in the slit portions 25 in a press-fitted state. The stopper portions 27 protrude slightly outward (upward and downward) from the opposite principal surfaces of the frame base 21.

The insulating elastic member 14b protrude from the opposite principal surfaces of the frame base 21 to form protruding parts. The protruding parts with the conductors 14a formed thereon serve as electrical contact points. The frame base vertical portions 23a and 23b are provided with the frame positioning holes 25a and 25b formed at intermediate positions in the first and the second directions B and C, respectively.

As shown in FIGS. 4 and 5, the frame member 31 is a generally rectangular frame. The frame member 31 has a pair of horizontal portions 33a and 33b faced to each other in the first and the second directions B and C and extending in the transversal direction E in parallel to each other, and a pair of vertical portions 35a and 35b faced to each other in the transversal direction E and extending in the first and the second directions B and C in parallel to each other.

The horizontal portions 33a and 33b are substantially equal in transversal width in the transversal direction E and in length in the first and the second directions B and C to the frame base horizontal portions 21a and 21b of the frame base 21. The vertical portions 35a and 35b are substantially equal in transversal width in the transversal direction E and in length in the first and the second directions B and C to the frame base vertical portions 23a and 23b of the frame base 21.

The frame member 31 is formed by punching a thin metal plate by a press and thereafter bending the thin metal plate.

The frame member 31 is provided with protruding portions 37a, 37b, 37c, and 37d formed at four corners thereof to protrude in the first and the second directions B and C. Among the protruding portions 37a, 37b, 37c, and 37d, two protruding portions 37a and 37d are provided with positioning holes 37g and 37h, respectively.

The horizontal portions 33a and 33b are provided with press-fit portions 38a, 38b, 38c, and 38d formed inside the protruding portions 37a, 37b, 37c, and 37d and in the vicinity thereof, respectively. The press-fit portions 38a, 38b, 38c, and 38b extend outward from the horizontal portions 33a and 33b and have end portions bent downward and located below the horizontal portions 33a and 33b.

The vertical portions 35a and 35b are provided with the positioning pins 36a and 36b formed at intermediate positions in the first and the second directions B and C, respectively. These positioning pins 36a and 36b extend downward from lower surfaces of the vertical portions 35a and 35b so as to be inserted into the frame positioning holes 25a and 25b in one-to-one correspondence.

As illustrated in FIG. 5, the strengthening frame 41 has a generally rectangular shape and has a pair of strengthening horizontal portions 43a and 43b faced to each other in the first and the second directions B and C and extending in the transversal direction E in parallel to each other, and a pair of strengthening vertical portions 45a and 45b faced to each other in the transversal direction E and extending in the first and the second directions B and C in parallel to each other. The strengthening frame 41 is engaged with and held by the frame member 31.

The strengthening frame 41 may be formed by punching a thin metal plate by a press. The strengthening horizontal portions 43a and 43b are faced to the frame base horizontal portions 21a and 21b of the frame base 21. The strengthening horizontal portions 43a and 43b are increased in width at intermediate portions thereof to form a pair of protruding portions 43d and 43e protruding outward from the remaining portions of the strengthening horizontal portions 43a and 43b.

The strengthening vertical portions 45a and 45b are substantially equal in transversal width in the transversal direction E and in length in the first and the second directions B and C to the frame base vertical portions 23a and 23b of the frame base 21.

The frame member 31 is provided with the positioning pins 36a and 36b adapted to pass through the positioning holes 47a and 47b and the frame positioning holes 25a and 25b. The positioning holes 25a and 25b are greater in diameter than the positioning holes 36a and 36b.

The strengthening vertical portions 45a and 45b are provided with the positioning holes 47a and 47b formed at intermediate positions in the first and the second directions B and C. The positioning holes 47a and 47b are coincident with the positioning holes 25a and 25b of the frame base 21 and are adapted to receive the positioning pins 36a and 36b of the frame member 31. The positioning pins 36a and 36b pass through the frame positioning holes 25a and 25b to protrude downward.

Next, description will be made of the block members 51. The block members 51 are same in shape.

The block members 51 are formed by molding a resin material and have a shape extending long in the transversal direction E. The block members 51 have confronting surfaces 53a faced to the strengthening horizontal portions 43a and 43b of the strengthening frame 41, respectively, and step portions 54 formed at intermediate portions of the confronting surfaces 53a from an upper surface to a lower surface. The step portions 54 are substantially equal in length in the transversal direction E to the protruding portions 43d and 43e of the strengthening frame 41 and are adapted to mount and receive the protruding portions 43d and 43e.

Each of the step portions 54 has a slide receiving portion 55 in the form of a hole formed at a center area in the transversal direction E. Outside the step portions 54 in the transversal direction E, press-fit holes 57a and 57b, four in total, are formed to extend from the upper surface to the lower surface. The press-fit holes 57a and 57b are adapted to receive the press-fit portions 38a, 38b, 38c, and 39d of the frame member 31 which are press-fitted therein in one-to-one correspondence.

In addition, the block members 51 are provided with positioning holding holes 58a and 58b formed near one end and the other end in the transversal direction E, respectively. Each of the positioning holding holes 58a and 58b penetrates the block member 51 from the upper surface to the lower surface. The positioning holding holes 58a and 58b are coincident with the positioning holes 37g and 37h formed on the protruding portions 37a and 37d of the frame member 31, respectively.

Furthermore, each of the block members 51 has an opening portion 59 formed on a rear side of the slide receiving portion 55. The opening portion 59 is continuously formed on the upper and the lower surfaces of the block member 51 and a rear surface 53b opposite to the confronting surface 53a. In the slide receiving portion 55, a sliding member 61 is fitted so as to be slidable in the transversal direction E. The sliding member 61 has a slide plate portion 63 inserted into the slide receiving portion 55 and an operating portion 65 formed on a rear part of the slide plate portion 63 to slide the slide plate portion 63 in the transversal direction E. The slide plate portion 63 has a cut portion 67 extending from a front edge towards the rear part.

Next, assembling of the above-mentioned connector will be described. By metal sputtering, the conductors 14a are adhered to the insulating elastic member 14b to form each contact module. Thereafter, the contact modules are received in the slit portions 25 of the frame base 21. The frame base 21 and the strengthening frame 41 are adhered to each other in the manner such that the positioning holes 25a and 25b of the frame base 21 and the positioning holes 47a and 47b of the strengthening frame 41 are coincident in position with each other.

The frame base 21 and the strengthening frame 41 may be adhered by the use of a double-sided adhesive tape or an adhesive agent. The strengthening frame 41 serves to correct warping of the frame base 21 and to improve mechanical strength.

Then, the slide plate portions 63 of the sliding members 61 are inserted into the slide receiving portions 55 of the block members 51. Thereafter, the protruding portions 43d and 43e of the strengthening frame 41 are placed on the step portions 54 of the block members 51. Then, the confronting surfaces 53a of the block members 51 are brought into contact with the frame base horizontal portions 21a and 21b of the frame base 21, respectively.

Figure 9:
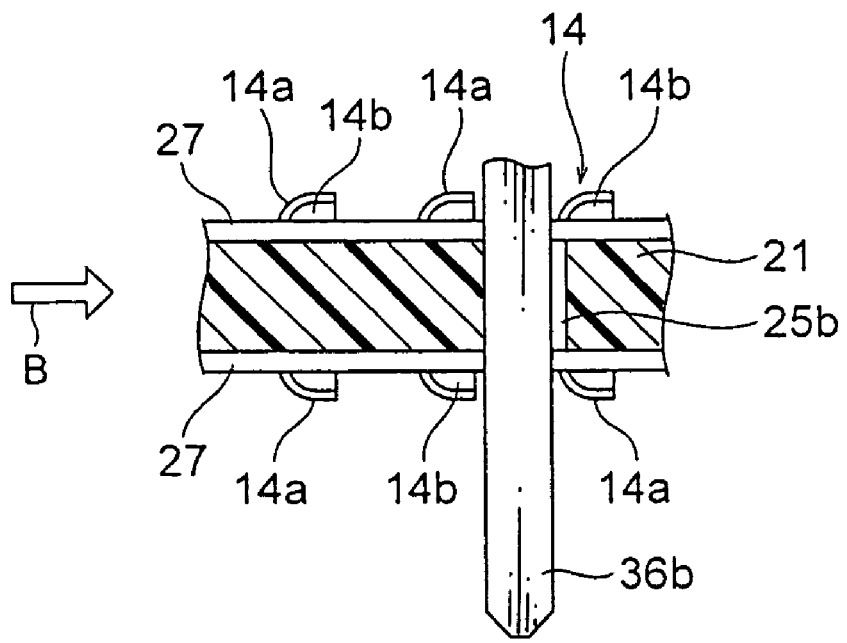
FIG. 9 is an enlarged sectional view of a part of the connector illustrated in FIG. 4.

Further, the frame member 31 is placed on the strengthening frame 41. As illustrated in FIG. 9, the positioning pins 36a and 36b of the frame member 31 are inserted through the positioning holes 47a and 47b of the strengthening frame 41 into the frame positioning holes 25a and 25b of the frame base 21. Simultaneously, the press-fit portions 38a, 38b, 38c, and 38d of the frame member 31 are press-fitted into the press-fit holes 57a and 57b of the block members 51.

The spring portions 21e are pressed by the block members 51 to be displaced. At this time, the frame base 21 as a whole is pushed in the first direction B. In this event, a clearance between the frame positioning holes 25a and 25b of the frame base 21 and the positioning pins 36a and 36b of the frame member 31 is great. Therefore, the frame base 21 is pushed and moved in the first direction B.

Specifically, the spring members 21e are displaced when it is incorporated into the frame member 31 and the block members 51. At this time, the frame base 21 is pushed in the first direction B. Therefore, as illustrated in FIG. 9, the positioning pins 36a and 36b are brought into contact with an inner surface of the frame positioning holes 25a and 25b. The frame base 21 is slightly moved in the first direction B so that the end faces of the positioning holes 25a and 25b are continuously kept in contact with the positioning pins 36a and 36b of the frame member 31. Thus, the frame base 21 is put into an engaged state. Since positioning between the frame base 21 and the frame member 31 is always constant, positioning between the conductors 14a of the contacts 14 and conductive pads (not shown) of the printed board 1 is easy.

Upon fitting, the insulating elastic member 14b is compressed. A force pressing the frame base 21 is generated in the second direction C on the side of the conductors 14a of the contacts 14. Then, the spring portions 21e of the frame base 21 are further compressed and the frame base 21 is slightly moved in the second direction C. As a result, the conductors 14a are not bent without being pressed against the frame base 21. Therefore, positioning between the conductors 14a of the contacts 14 and the conductive pads (not shown) of the connection object 5 is easy.

Thus, the frame base 21, the frame member 31, the strengthening frame 41, and the block members 51 with the sliding members 61 are integrally coupled and assembling of the connector of a double-sided connection type is completed.

In the following, connection with the connection objects after the contacts 14 are press-fitted into the frame base 21 will be described in detail. Herein, as shown in FIG. 8, the thickness (the dimension in a thickness direction) of the frame base 21 is represented by L1. The height (the dimension in a height direction) of the stopper portions 27 is represented by L2. The height (the dimension in the height direction) of each contact 14 is represented by L3.

Figure 10A:
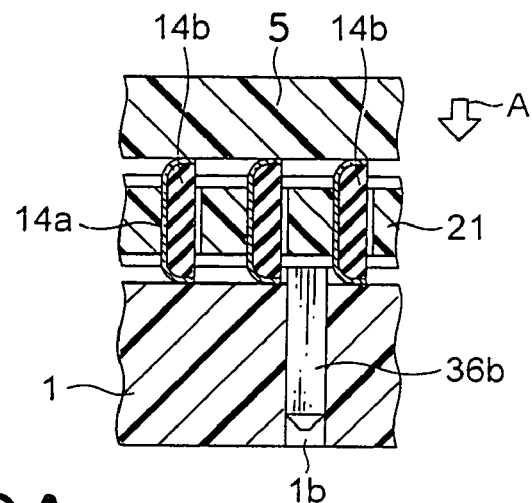
FIG. 10A is a sectional view of the connector and the connection objects illustrated in FIG. 4 in a state before connection.

As illustrated in FIG. 10A, the connector is sandwiched between the printed board 1 (second connection object) and the connection object 5 (first connection object) so that the printed board 1 and the connection object 5 are electrically connected to each other. The positioning pin 36b inserted through the positioning hole 1b of the printed board 1.

In the connector mentioned above, a displacement sufficient for electrical connection is obtained in the following manner. The dimensions L1, L2, and L3 illustrated in FIG. 8 are preliminarily obtained. A load is applied so that the printed board 1 and the connection object 5 are pressed against each other at the height L2 of the stopper portion 27. Even if a mechanical shock is applied in this state, the mechanical shock is applied to the frame base 21. It is therefore possible to prevent the insulating elastic member 14b from being damaged by deformation.

Figure 10B:
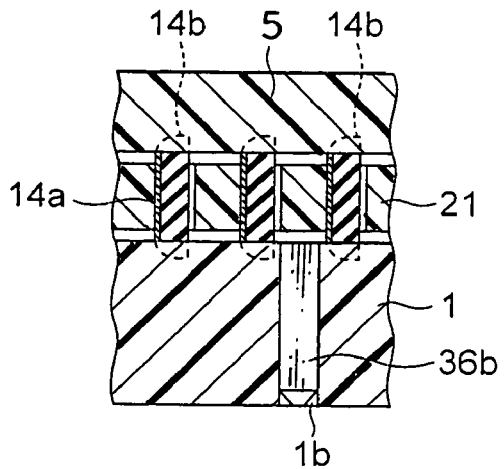
FIG. 10B is a sectional view similar to FIG. 10A but in a half-connected state.
Figure 10C:
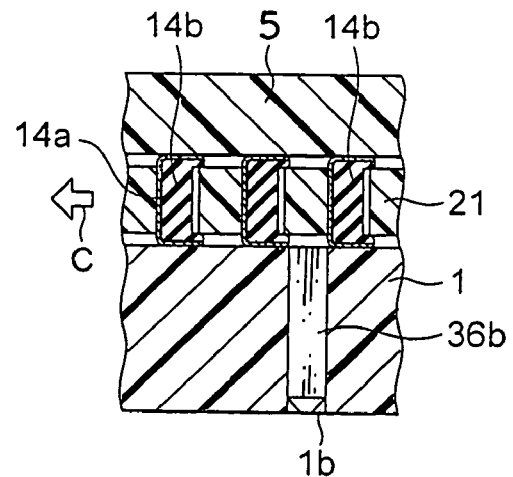
FIG. 10C is a sectional view similar to FIG. 10A but in a connected state.

Referring to a half-connected state in FIG. 10A and a connected state in FIG. 10B, the printed board 1 and the connection object 5 after positioning are pressed against the stopper portion 27 and fixed by the pressing force exerted in the connecting direction A (FIG. 10A). At this time, the insulating elastic member 14b compressed and deformed is going to expand in a direction parallel to the principal surfaces of the frame base 21 in response to the compression and the deformation. At this time, as illustrated in FIG. 10C, the frame base 21 is pressed towards the side of the conductors 14a kept in tight contact with the insulating elastic member 14b (in the second direction C) so that the spring portions 21e are displaced. The frame base 21 is moved in the second direction C. Simultaneously, the upper and the lower deformed portion of each contact 14 protrude in the first direction B in response to the pressing force.

When the printed board 1 is placed in a standing position after the connector is mounted on the printed board 1, the sliding members 61 serve to provisionally or temporarily lock the connector without undesired disengagement. The provisional locking by the sliding members 61 is described in detail, for example, in JP-A-2006-054149 and will not be described herein.

In the above-mentioned connector also, the frame base 21 is moved in the second direction C opposite to the first direction B in response to the pressing force upon connection with the connection object 5 after assembling with the frame member 31 and mounting on the printed board 1 as the connection object and against the urging force in the first direction B exerted by the spring portions 21e integrally formed therewith. In this event, the upper and the lower deformed parts of the contacts 14 protrude in the first direction B in response to the pressing force upon connection with the connection object 5.

The conductors 14a may be formed on the contacts 14 by metal sputtering or metal plating. In the foregoing description, the spring portions 21e are integral with the frame base 21. Alternatively, the spring portions 21e as metal spring elastic members as separate components may be coupled to an end face of the frame base 21.

In the stopper portions 27 for preventing the collapse due to over-compression, an area to which the printed board 1 is contacted is desirably as large as possible. In particular, a large area is effective in case where the connector has a large size or the printed board 1 is heavily warped. Further, in the third embodiment, the insulating elastic member 14b is made of rubber. Alternatively, use may be made of a structure in which each contact 14 is formed by attaching the conductor 14a to a gel and the contacts 14 thus formed are held by the frame base. In addition, the frame member 31, the strengthening frame 41, the block members 51, and the sliding members 61 may be made of a material, such as a resin material, other than a metal material as far as a sufficient mechanical strength is obtained.

The above-mentioned connector is connected to the pads 1a and 5a of the connection object 5 and the printed board 1 with a sliding movement. Therefore, contaminants on the surface of contacting portions can be removed and stable connection is established.

Each of the above-mentioned connectors is applicable to electrical connection of printed boards to each other, electrical connection of a surface-mount semiconductor socket and various types of printed boards, electrical connection of a semiconductor IC socket and a test circuit board, and so on and is expected to exhibit the following effects.

1. Even if the pressing force during connection with the connection objects is considerably large, the ribs are not deformed or damaged. Disconnection or short-circuiting at each contact is extremely difficult to occur. As a result, contact failure is stably prevented and reliability during use is high.

2. The contact has a structure in which the upper and the lower deformed parts protrude in the first direction in response to the pressing force upon connection with the connection objects. Therefore, when the contacts obtained by forming the conductors on the surface of the insulating elastic member are contacted with the connection objects, it is possible to reliably prevent contact failure or short-circuiting due to elastic deformation.

3. By an elastic mechanism provided at the frame, the frame base is continuously pressed against the positioning pins of the frame member. Therefore, positioning error can be prevented.

4. Even if the elastic member is compressed during fitting, the frame is not fixed but moved in one direction. Therefore, the conductors are not bent. It is consequently possible to prevent a damage or the like due to bending of the elastic member and to improve the lifetime.

5. The frame is not completely fixed and can be moved. Therefore, positioning error with respect to the connection object can be removed.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A connector to be connected by press contact in a connecting direction, the connector comprising:
    a first frame which has two principal surfaces opposite to each other in the connecting direction;
    a plurality of contacts which are coupled to the first frame; and
    a second frame which is coupled to the first frame and guides the first frame in a specific direction perpendicular to the connecting direction;
    wherein each of the contacts comprises:
    an insulating elastic member; and
    a conductor which is combined with the elastic member, and
    wherein the conductor includes portions which protrude from the principal surfaces, respectively, wherein the elastic member is compressed by the press contact and moves the first frame with respect to the second frame in one direction of the specific direction.

2. The connector according to claim 1, wherein the first frame is movable with respect to the second frame only in the specific direction.

3. The connector according to claim 1, further comprising urging means urging the first frame with respect to the second frame in the other direction of the specific direction.

4. The connector according to claim 3, wherein the second frame has a butting surface which is faced to the first frame in the one direction of the specific direction and limits the movement of the first frame.

5. The connector according to claim 3, wherein the second frame has an engaging surface which is faced to the first frame in the other direction of the specific direction and limits the movement of the first frame.

6. The connector according to claim 1, wherein the first frame is movable with respect to the second frame not only in the specific direction but also in the connecting direction.

7. The connector according to claim 6, wherein the second frame has a guiding surface for guiding the first frame in an oblique direction inclined with respect to both of the connecting direction and the specific direction.

8. The connector according to claim 7, wherein the first frame has a guided surface which is faced to the guiding surface and is parallel to the guiding surface.

9. The connector according to claim 1, wherein the first frame comprises:
    a frame base which holds the contacts; and
    a strengthening frame which is attached to the frame base;
    wherein the second frame comprises:
    a frame member; and
    a pair of block members which is coupled to the frame member;
    wherein the strengthening frame is held by the frame member via the block members.

10. The connector according to claim 9, wherein the frame base includes a spring portion formed at one end in the specific direction, and the spring portion is engaged with the block members to urge the frame base in the specific direction.

11. The connector according to claim 10, wherein the frame base and the strengthening frame have positioning holes, respectively, the frame member includes a positioning pin which passes through the positioning holes, and the positioning hole of the frame base is greater in diameter than the positioning pin.

12. The connector according to claim 10, wherein the frame base is moved in a direction opposite to an urging direction by the spring portion in response to the press contact, thereby allowing each contact to partially protrude in the specific direction.

* * * * *